United States Patent
Kim et al.

(10) Patent No.: US 7,963,247 B2
(45) Date of Patent: Jun. 21, 2011

(54) DIFFUSION TUBE, DOPANT SOURCE FOR A DIFFUSION PROCESS AND DIFFUSION METHOD USING THE DIFFUSION TUBE AND THE DOPANT SOURCE

(75) Inventors: Gi-bum Kim, Yongin-si (KR); Taek Kim, Yongin-si (KR); Jae-min Myoung, Seoul (KR); Min-chang Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 234 days.

(21) Appl. No.: 11/673,321

(22) Filed: Feb. 9, 2007

(65) Prior Publication Data

US 2007/0272990 A1  Nov. 29, 2007

(30) Foreign Application Priority Data

May 25, 2006  (KR) ........................ 10-2006-0047219

(51) Int. Cl.
    *C23C 16/00* (2006.01)
    *C23C 16/448* (2006.01)

(52) U.S. Cl. ................... 118/723 VE; 118/726

(58) Field of Classification Search .................. 118/726, 118/723 E, 723 VE
See application file for complete search history.

(56) References Cited

U.S. PATENT DOCUMENTS

| | | | | |
|---|---|---|---|---|
| 2,157,478 | A | * | 5/1939 | Burkhardt et al. ............ 427/523 |
| 3,096,209 | A | * | 7/1963 | Ingham, Jr. .................... 117/100 |
| 4,094,269 | A | * | 6/1978 | Malinovski et al. .......... 118/726 |
| 4,389,973 | A | * | 6/1983 | Suntola et al. ................. 118/725 |
| 4,668,480 | A | * | 5/1987 | Fujiyashu et al. ............. 118/719 |
| 5,019,531 | A | * | 5/1991 | Awaya et al. .................. 438/605 |
| 5,542,979 | A | * | 8/1996 | Matsuno et al. ............... 118/719 |
| 2006/0156986 | A1 | * | 7/2006 | Hiraga et al. .................. 118/726 |
| 2007/0272990 | A1 | * | 11/2007 | Kim et al. ....................... 257/410 |
| 2008/0107811 | A1 | * | 5/2008 | Guyaux et al. ............... 427/255.6 |
| 2008/0152903 | A1 | * | 6/2008 | Von Kaenel ................... 428/337 |

FOREIGN PATENT DOCUMENTS

JP           04293768 A  * 10/1992

OTHER PUBLICATIONS

"Sealed-ampoule diffusion of zinc into Ga 1-x Alx As at 650 C"; Authors: V. Qunitana, et al.; J. Appl. Phys. 63 (7), Apr. 1, 1988, pp. 2454-2455.

"Effects of post-diffusion annealing on Zn-diffused GaAs:Si" Authors: Nguyen Hong Ky, et al.; J. Appl. Phys. 74 (9), Nov. 1, 1993, pp. 5493-5500.

"Studies on zinc diffusion in gallium arsenide by rapid thermal processing"; Authors: G. Rajeswaran, et al.; J. Appl. Phys. 69 (3), Feb. 1, 1991, pp. 1359-1365.

* cited by examiner

*Primary Examiner* — Jeffrie R Lund
(74) *Attorney, Agent, or Firm* — Cantor Colburn LLP

(57) ABSTRACT

According to an exemplary embodiment of the present invention, a diffusion tube includes a diffusion housing which includes a first cavity within a first end which receives a diffusion target, a second cavity within a second end which receives a dopant source for diffusion, and a diffusion port disposed between the diffusion target and the dopant source, wherein the diffusion port provides fluid communication between the first cavity and the second cavity.

9 Claims, 5 Drawing Sheets

DIFFUSION TUBE, DOPANT SOURCE FOR A DIFFUSION PROCESS AND DIFFUSION METHOD USING THE DIFFUSION TUBE AND THE DOPANT SOURCE

This application claims priority to Korean Patent Application No. 10-2006-0047219, filed on May 25, 2006, and all the benefits accruing therefrom under 35 U.S.C. §119, the contents of which in its entirety are herein incorporated by reference.

BACKGROUND OF THE INVENTION

1. Field of the Invention

The present invention relates to a diffusion tube used for a diffusion process in the fabrication of semiconductor devices, a dopant source used for a diffusion process and a diffusion method using the diffusion tube and the dopant source.

2. Description of the Related Art

Semiconductors are formed when the electrical properties of certain materials or alloys are permanently modified by the introduction of impurities, in a process known as doping. Diffusion is a phenomenon where atoms move from a high concentration region to a low concentration region. The diffusion phenomenon occurs due to a gradient of concentration, and continues until a uniform concentration is achieved. The diffusion speed varies in accordance with the temperature of the atoms being diffused. The diffusion phenomenon explains the movement of impurity atoms within a chemical semiconductor.

A semiconductor device is normally fabricated by repeatedly performing a diffusion process, an ion implantation process, a photolithography process and an etch process periodically. The diffusion process is performed in order to form a layer on a semiconductor substrate or to diffuse implanted ions into a semiconductor substrate using the diffusion phenomenon. FIG. 1 illustrates a conventional ampoule used as a diffusion tube 1 in the diffusion process of the prior art. Referring to FIG. 1, the diffusion tube 1 is a conventional ampoule formed of a quartz tube, and is used when performing a conventional diffusion process using a vacuum-sealed ampoule method of the prior art. In the vacuum-sealed ampoule method, the diffusion process is performed by disposing a dopant source 3 into the diffusion tube 1; disposing a diffusion target 2 which is to be diffused on, typically a semiconductor substrate, into the diffusion tube 1; sealing the diffusion tube 1; and heating the diffusion tube 1.

However, certain types of semiconductor devices require an intense diffusion of impurities. For example, in the fabrication of a vertical cavity surface emitting laser ("VCSEL"), impurities must diffuse sufficiently deep since the mirror stack is very thick, which can range from several micrometers ($\mu m$) to tens of micrometers ($\mu m$). However, conventional diffusion processes which diffuse impurities to the sufficient depths are extremely time consuming. Table 1 illustrates experiment data achieved when zinc (Zn) impurities are diffused into a gallium arsenide ("GaAs") substrate using a conventional diffusion method.

TABLE 1

| diffusion method | dopant source | diffusion temperature (degrees Celsius) | diffusion speed (micrometer/hour) | electrical characteristics | references |
|---|---|---|---|---|---|
| RTA | Zn-silicate | 650-750 | 2.0 $\mu m/hr$ | | J. Appl. Phys. 69(3) (1991), p. 1359. |
| furnace (vacuum-sealed) | $ZnAs_2$ | 600 | 0.2 $\mu m/hr$ | $p = 1 \times 10^{20}$ $cm^{-3}$ | J. Appl. Phys. 74(9) (1993), p. 5493. |
| furnace (vacuum-sealed) | $ZnAs_2$ | 650 | 0.5 $\mu m/hr$ | | J. Appl. Phys. 63(7) (1988), p. 2454. |

Referring to Table 1, the dopant source 3 in the conventional diffusion method is a zinc-silicate thin film, and a gallium arsenide chemical powder. Using the vacuum-sealed method, the diffusion speed was less than 1 micrometer per hour ($\mu m/hr$). When using a rapid thermal annealing ("RTA") furnace, the diffusion speed was 2.0 micrometers per hour ($\mu m/hr$) at a temperature of 650 degrees Celsius. The RTA furnace, however, exhibits some problems such as vaporization of arsenic (As) on a GaAs substrate at high temperatures and the like; thereby failing to provide good diffusion results as compared to the vacuum-sealed method. Furthermore, conventional diffusion methods have many disadvantages, such as low diffusion speeds, which increase the fabrication time and the total cost for fabrication of semiconductor devices.

BRIEF SUMMARY OF THE INVENTION

The present invention includes a diffusion tube which is improved in structure, a dopant source used in a diffusion process and a diffusion method capable of effectively performing a diffusion process using the diffusion tube and the dopant source.

In an exemplary embodiment of the present invention, the diffusion tube includes a diffusion housing which includes a first cavity at a first end which receives a diffusion target and a second cavity at a second end which receives a dopant source for diffusion, and a diffusion port disposed between the diffusion target and the dopant source, wherein the diffusion port provides fluid communication between the first cavity and the second cavity.

In another exemplary embodiment, the diffusion tube includes a first tube which includes a first cavity which receives a diffusion target, a second tube which includes a second cavity which receives a dopant source for diffusion, and a neck which connects the first and second tubes such that the first and second cavities are in fluid communication, and the diffusion target and the dopant source are spaced apart from each other via the neck.

In another exemplary embodiment, the present invention includes a dopant source for a diffusion process used to dope a gallium arsenide ("GaAs") substrate with zinc (Zn), wherein the dopant source includes zinc (Zn) powder and arsenic (As) powder.

In another exemplary embodiment, the present invention includes a diffusion method of doping a group III-V chemical semiconductor with zinc (Zn), and the method includes disposing a dopant source and the group III-V chemical semiconductor into a diffusion tube which includes a diffusion housing which includes a first cavity at a first end and receives the group III-V chemical semiconductor, and a second cavity at a second end and receives the dopant source for diffusion, and a diffusion port disposed between the diffusion target and the dopant source, wherein the diffusion port includes a sectional area less than a sectional area of the diffusion target, and the first cavity and the second cavity are in fluid communication with each other; and heating the sealed diffusion tube to a predetermined temperature, wherein the dopant source is diffused into the group III-V chemical semiconductor.

BRIEF DESCRIPTION OF THE DRAWINGS

The above and other aspects, features and advantages of the present invention will become more apparent by describing in more detail exemplary embodiments thereof with reference to the accompanying drawings, in which.

DETAILED DESCRIPTION OF THE INVENTION

Figure 1:
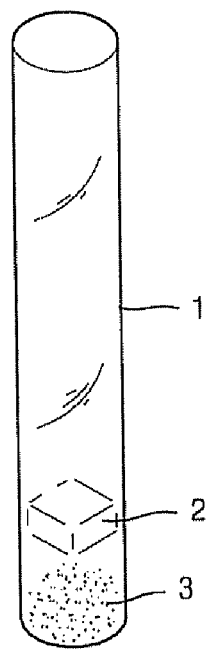
FIG. 1 is a schematic perspective view illustrating a conventional diffusion tube of the prior art.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

The present invention will now be described more fully with reference to the accompanying drawings, in which exemplary embodiments of the invention are shown. The diffusion tube 10 used in the diffusion process according to an exemplary embodiment of the present invention will now be described in more detail with reference to the accompanying drawings.

Figure 2:
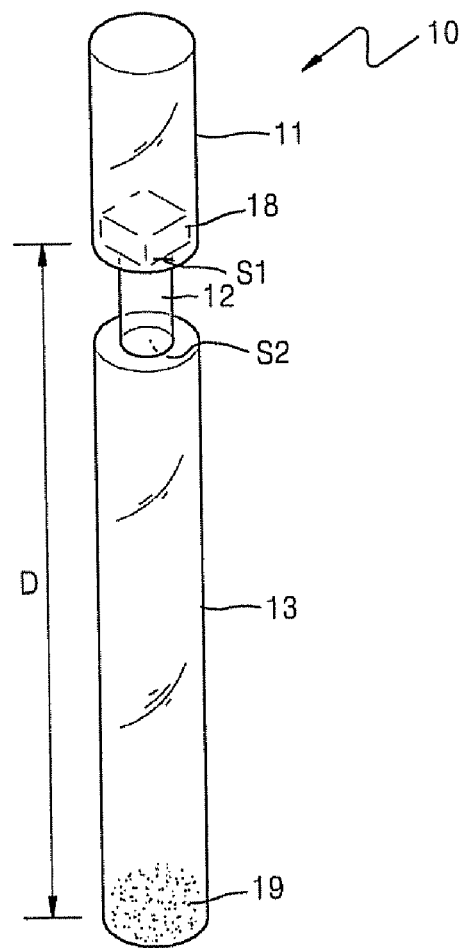
FIG. 2 is a schematic perspective view illustrating an exemplary embodiment of a diffusion tube according to the present invention.

FIG. 2 is a schematic perspective view illustrating an exemplary embodiment of a diffusion tube 10 according to the present invention.

Referring to FIG. 2, the diffusion tube 10 includes a first tube 11 into which a diffusion target 18 is placed, a second tube 13 into which a dopant source 19 is placed, and a neck 12 which connects the first and second tubes 11 and 13. The diffusion target 18 and the dopant source 19 are spaced apart from each other by a distance D, with the neck 12 disposed between the diffusion target 18 and the dopant source 19. In an exemplary embodiment, the diffusion tube 10 of the present invention has a tubular shape which includes the neck 12, and is configured such that the diffusion target 18 and the dopant source 19 are spaced apart from each other, with the neck 12 disposed therebetween.

In an exemplary embodiment, the diffusion tube 10 is composed of a quartz material.

The first tube 11 includes a first cavity which receives the diffusion target 18, and the second tube 13 includes a second cavity which receives the dopant source 19.

Figure 3:
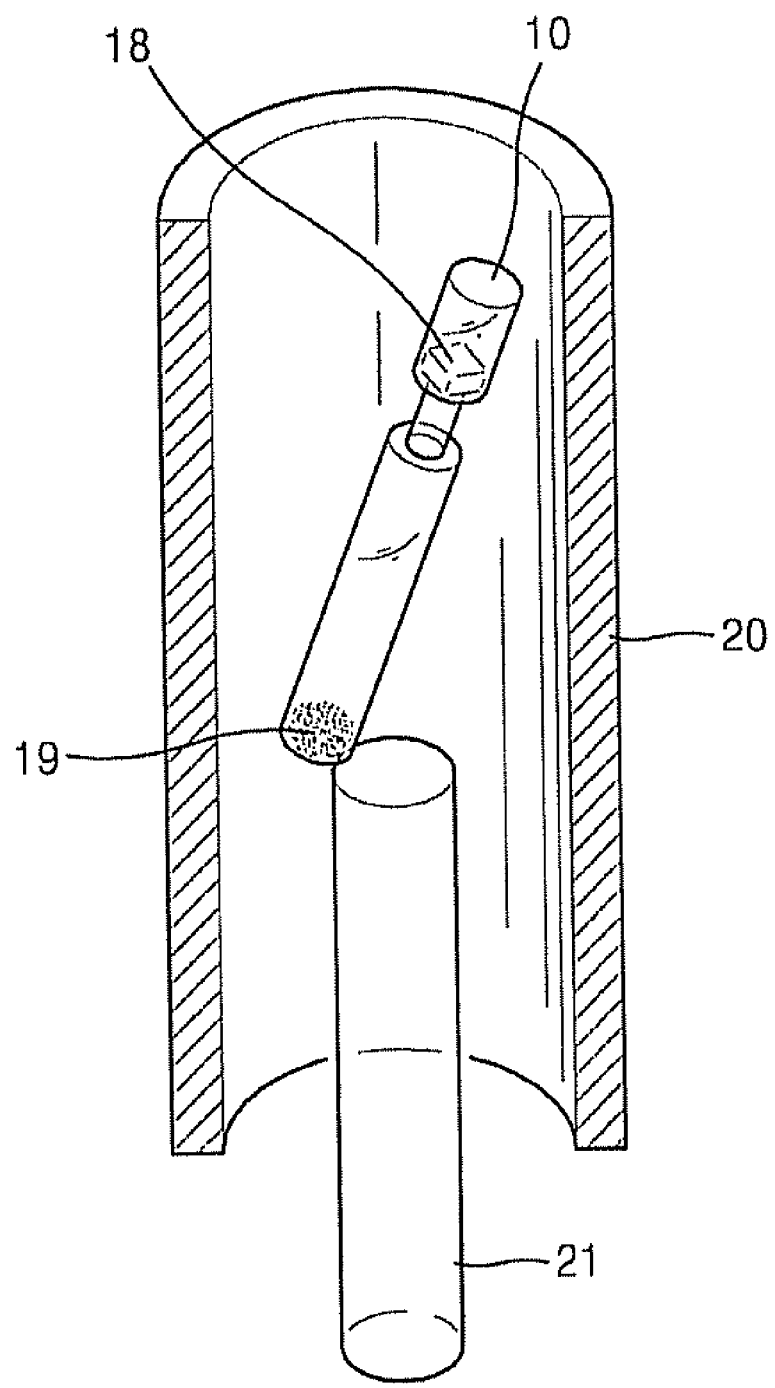
FIG. 3 is a schematic perspective view illustrating a cross-sectional view of a diffusing apparatus using an exemplary embodiment of the diffusion tube of FIG. 2 according to the present invention.

The neck 12 is a path which connects the first and second cavities such that the dopant source 19 is diffused into the diffusion target 18. As in the illustrated exemplary embodiment of FIG. 2, the sectional area S2 of the neck 12 is less than the sectional area S1 of the diffusion target 18, such that the dopant source 19 can be uniformly diffused into the diffusion target 18. The sectional area S2 of the neck 12, which is less than the sectional area S1 of the diffusion target 18, provides for greater control of the diffusion regions of the diffusion target 18, and also prevents the diffusion target 18 from falling down from the first tube 11 into the second tube 13 when performing a diffusion process with the diffusion tube 10 vertically disposed, as illustrated in FIG. 3.

A hole (not shown) is provided at one end of at least one of the first and second tubes 11 and 13, such that the dopant source 19 and the diffusion target 18 can pass through the hole (not shown) in order to be placed into the second and first cavity, respectively. In one exemplary embodiment of the diffusion tube 10, a single hole (not shown) is formed at one end of the first tube 11 in order to put the dopant source 19 and the diffusion target 18 into the diffusion tube 10, since the sectional area S2 of the neck 12 is less than the sectional area S1 of the diffusion target 18 and the diffusion target 18 would not be able to fit through the neck 12 if a single hole is formed at one end of the second tube 13.

In one exemplary embodiment, the diffusion tube 10 is vacuum-sealed during the diffusion process. In order to seal the hole or holes (not shown) provided at one end of at least one of the first and second tubes 11 and 13 of the diffusion tube 10, a sealing quartz bar is placed into the hole or holes (not shown) and welded using a torch after the dopant source 19 and the diffusion target 18 are placed into the diffusion tube 10. The diffusion tube 10 can be reused since at least one of the first and second tubes 11 and 13 is formed to be capable of being opened and closed. The sealing structure is well known to those skilled in the art, and thus a detailed explanation thereof will be omitted.

In other alternative exemplary embodiments, the diffusion tube 10 may include a diffusion housing (not shown) defined by a first cavity at a first end into which the diffusion target 18 is disposed, and a second cavity at a second end into which the dopant source 19 is disposed. The diffusion target 18 and the dopant source 19 are spaced apart from each other by a distance with a diffusion port (not shown) disposed therebetween, wherein the diffusion port provides fluid communication between the first and second cavity. In these alternative exemplary embodiments, it will be recognized by those skilled in the pertinent art that the neck 12 (FIG. 2) between the first and second diffusion tubes 11 and 13 may be eliminated or may extend from one of the first and second diffusion tubes 11 and 13 into the other diffusion tube to which it is connected, such that the neck does not connect the first and second diffusion tubes 11 and 13 as described above.

In another exemplary embodiment, at least one hole (not shown) is provided at one end of the diffusion housing, wherein the dopant source 19 and the diffusion target 18 can pass through the hole (not shown) in order to be placed into the second and first cavity, respectively. In an exemplary embodiment, the diffusion housing includes a single hole (not shown) formed at the first end of the diffusion housing in order to put the dopant source 19 and the diffusion target 18 into the diffusion tube 10, since the sectional area of the diffusion port is less than the sectional area S1 of the target 18.

The dopant source 19 used in the diffusion process according to an exemplary embodiment of the present invention will now be described in more detail with reference to the accompanying drawings.

The dopant source 19 of the present invention is for doping group III-V chemical semiconductors with zinc (Zn).

A gallium arsenide ("GaAs") semiconductor, which is a conventional group III-V chemical semiconductor, is formed by implanting impurities into the chemical crystal, composed of gallium (Ga) and arsenic (As), so as to generate free electrons or holes. When an electron gains enough energy to escape the electrostatic attraction of its parent atom, it leaves behind a vacancy that may be filled by another electron. The vacancy produced, also known as a hole, can be thought of as a second carrier of positive charge. The chemical semiconductor may include p-type or n-type semiconductor characteristics by changing the ratios of the component elements. The conventional group III-V chemical semiconductor may be composed of materials of two types of elements such as gallium arsenide ("GaAs") or indium phosphide ("InP"), three types of elements such as aluminum gallium arsenide ("AlGaAs") or gallium indium arsenide ("GaInAs"), and four types of elements such as gallium indium arsenide phosphide ("GaInAsP") and the like.

In an exemplary embodiment, the dopant source 19 used to diffuse zinc (Zn) into the conventional group III-V chemical semiconductor may be a chemical powder including zinc (Zn) or a mixture including zinc (Zn) powder.

Table 2 illustrates experiment data showing the measured diffusion speeds of zinc (Zn) into a GaAs substrate using the diffusion tube 10 of the present invention, and varying a mixing ratio of zinc (Zn) powder and arsenic (As) powder, which were used as the dopant source 19.

TABLE 2

| zinc (Zn):arsenic (As) mixing ratio | diffusion speed (micrometers/hour) (μm/hr) |
| --- | --- |
| 1:1(10 mg:10 mg) | 1.43 μm/hr |
| 1:1(20 mg:20 mg) | 1.57 μm/hr |
| 1:2(10 mg:20 mg) | 1.81 μm/hr |
| 2:1(20 mg:10 mg) | 2.36 μm/hr |

In the experiment illustrated in Table 2 above, the GaAs substrate had a length of 5 millimeters (mm) and a width of 5 millimeters (mm). The distance D (FIG. 2) between the GaAs substrate and the dopant source 19 was 5 centimeters (cm), and the diameter of the neck 12 of the diffusion tube 10 was 3 millimeters (mm). In addition, the diffusion tube 10 was maintained at a constant temperature of 700 degrees Celsius during the diffusion process, and a mixture of zinc (Zn) powder, with 99.999% purity and a diameter of 100 micrometers (μm), and arsenic (As) powder, with 99.9% purity, was used as the dopant source 19.

As shown in Table 2, when the dopant source 19 of the present invention, which is composed of zinc (Zn) powder and arsenic (As) powder, was used, the diffusion speed was at least 1 micrometer per hour (μm/hr) or higher. Particularly, when the mixing ratio of zinc (Zn) powder and arsenic (As) powder was 2:1, the diffusion speed was 2 micrometers per hour (μm/hr) or higher, which shows that the dopant source 19 diffused into the gallium arsenide ("GaAs") substrate extremely fast.

An exemplary embodiment of the dopant source 19 according to the present invention used to diffuse zinc (Zn) into the GaAs substrate is a mixture of zinc (Zn) powder and arsenic (As) powder, with a mixing ratio of zinc (Zn) powder and arsenic (As) powder of 2:1. As such, the dopant source 19 of the present invention provides for a higher diffusion speed than the diffusion speed provided by the conventional dopant source, which is to be explained below. The dopant source 19, thereby, reduces the fabrication time required for the fabrication processes, and also reduces the amount of defective products which may be produced during the fabrication processes.

Hereinafter, a diffusion method using the diffusion tube 10 and the dopant source 19 for the diffusion process according to an exemplary embodiment of the present invention will be now be described in more detail with reference to the accompanying drawings.

An exemplary embodiment of a diffusion method according to the present invention is performed using a vacuum-sealed method.

FIG. 3 is a schematic perspective view illustrating a diffusion process using an exemplary embodiment of the diffusion tube 10 according to the present invention. As illustrated in FIG. 3, the diffusion tube 10 is heated inside a heating furnace 20 after receiving the diffusion target 18 and the dopant source 19, in order to diffuse the dopant source 19 into the diffusion target 18.

First, a group III-V chemical semiconductor, used as the diffusion target 18, and the dopant source 19, which includes zinc (Zn), are disposed into the diffusion tube 10 of the present invention as described above. At this time, the diffusion target 18 and the dopant source 19 are disposed into the first and second tubes 11 and 13 of the diffusion tube 10, respectively, and the diffusion target 18 and the dopant source 19 are spaced apart from each other. Then, in order to remove impurities from inside the diffusion tube 10, the inside of the diffusion tube 10 is put into a high vacuum state using a vacuum pump (not shown), and the hole (not shown) which is located at the end of the diffusion tube 10 is then vacuum-sealed using a torch to weld a sealing quartz bar into the hole (not shown).

As shown in FIG. 3, the diffusion tube 10 is disposed into the heating furnace 20 and the diffusion tube 10 is heated using a heating unit (not shown). In an exemplary embodiment, the diffusion tube 10 is maintained heated to a constant temperature in a range between about 500 degrees Celsius to about 800 degrees Celsius. In exemplary embodiments, the diffusion tube is maintained heated to a constant temperature of about 700 degrees Celsius. In another exemplary embodiment, a thermocouple 21 is used to measure the temperature of the heating furnace 20. As such, when the diffusion tube 10 is heated to a predetermined temperature, the dopant source 19 inside the diffusion tube 10 is vaporized and is diffused into a predetermined portion of the diffusion target 18.

The diffusion tube 10 of the present invention is configured such that the first tube 11, where the diffusion target 18 is placed, and the second tube 13, where the dopant source 19 is placed, are connected by the neck 12. The uniformity of the diffusion and also the diffusion depth into the diffusion target 18 or portion thereof is easier to control since the vapor from the dopant source 19 diffuses into the diffusion target 18 through the neck 12, which includes a smaller sectional area S1 than the sectional area of the diffusion target S2.

In an exemplary embodiment, the dopant source 19 can be uniformly diffused into the diffusion target 18 to a predetermined depth when the diffusion tube 10 is used by being vertically erected, since a surface of the diffusion target 18 is placed over the neck 12 such that, the diffusion surface directly contacts the vapor of the dopant source 19. Furthermore, since the sectional area S1 of the diffusion target 18 is greater than the sectional area S2 of the neck 12, the diffusion target 18 is prevented from falling down into the second tube 13, even when the dopant source 19 is diffused with the diffusion tube 10 vertically erected, as illustrated in FIG. 3. However, the diffusion method of the present invention is not limited to the above exemplary embodiments of a method using the diffusion tube 10 which is vertically erected, and the diffusion process may be performed by horizontally laying the diffusion tube 10, with reference to FIG. 3.

After the dopant source 19 is diffused to a sufficient depth, the diffusion tube 10 is taken out of the heating furnace 20 in order to complete the diffusion process.

In one exemplary embodiment of the diffusion method, the time required to heat the diffusion tube 10 in the heating furnace 20 is proportional to the required diffusion depth. However, the diffusion method of the present invention provides for highly efficient fabrication processes due to the high diffusion speed and the efficiency of dopant source 19, which can diffuse to sufficient depths within a short amount of time.

In an exemplary embodiment of the diffusion method according to the present invention, the dopant source 19 can be uniformly diffused into the diffusion portion of the diffusion target 18 and to a predetermined depth, since the diffusion target 18 and the dopant source 19 are spaced apart from each other by the neck 12, which is disposed between the dopant source 19 and the diffusion target 18.

Figure 4A:
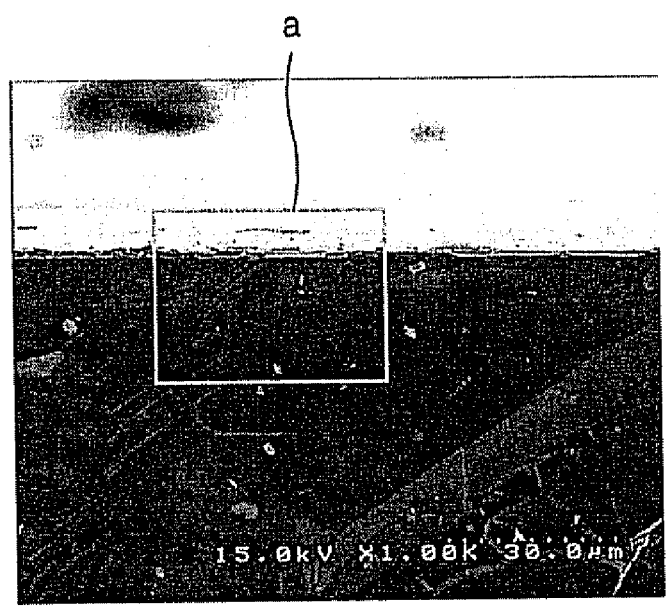
FIGS. 4A, 4B and 5 are photographs illustrating results of diffusing zinc (Zn) into a gallium arsenide ("GaAs") substrate under the same diffusion conditions except with different diffusion tubes.
Figure 4B:
Figure 5:
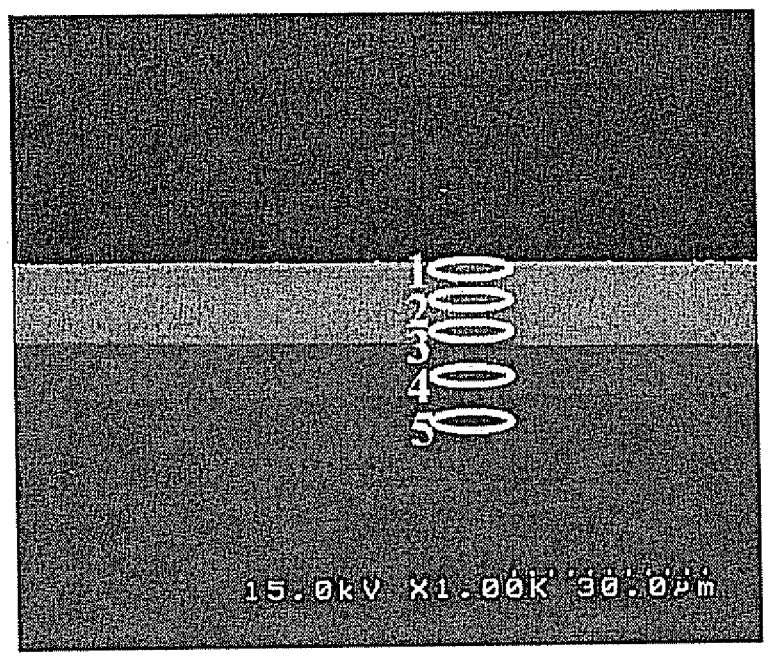

FIGS. 4A, 4B and 5 are photographs illustrating results of the diffusion process in which zinc (Zn) was diffused into a gallium arsenide ("GaAs") substrate under the same diffusion conditions except with different diffusion tubes, in order to illustrate the effects of the diffusion method using the diffusion tube 10 according to an exemplary embodiment of the present invention.

FIG. 4A is a photograph illustrating a section of the GaAs substrate into which zinc (Zn) was diffused into using the conventional diffusion tube 1, as illustrated in FIG. 1, and FIG. 4B is an enlarged photograph illustrating a portion "a" of the section of the GaAs substrate, as illustrated in FIG. 4A. FIG. 5 is a photograph illustrating a section of the GaAs substrate into which zinc (Zn) was diffused into using the diffusion tube 10 according to an exemplary embodiment of the present invention.

By comparing the photographs of FIGS. 4A and 4B, the diffusion method using the conventional diffusion tube 1 to diffuse zinc (Zn) into a section of a GaAs substrate illustrates a non-uniform diffusion result and a non-uniform diffusion depth, as illustrated in FIG. 4A. On the contrary, when diffusing zinc (Zn) into a section of a GaAs substrate using the diffusion tube 10 according to an exemplary embodiment of the present invention, the diffusion result and the diffusion depth are uniform, as illustrated in FIG. 4B.

Figure 6:
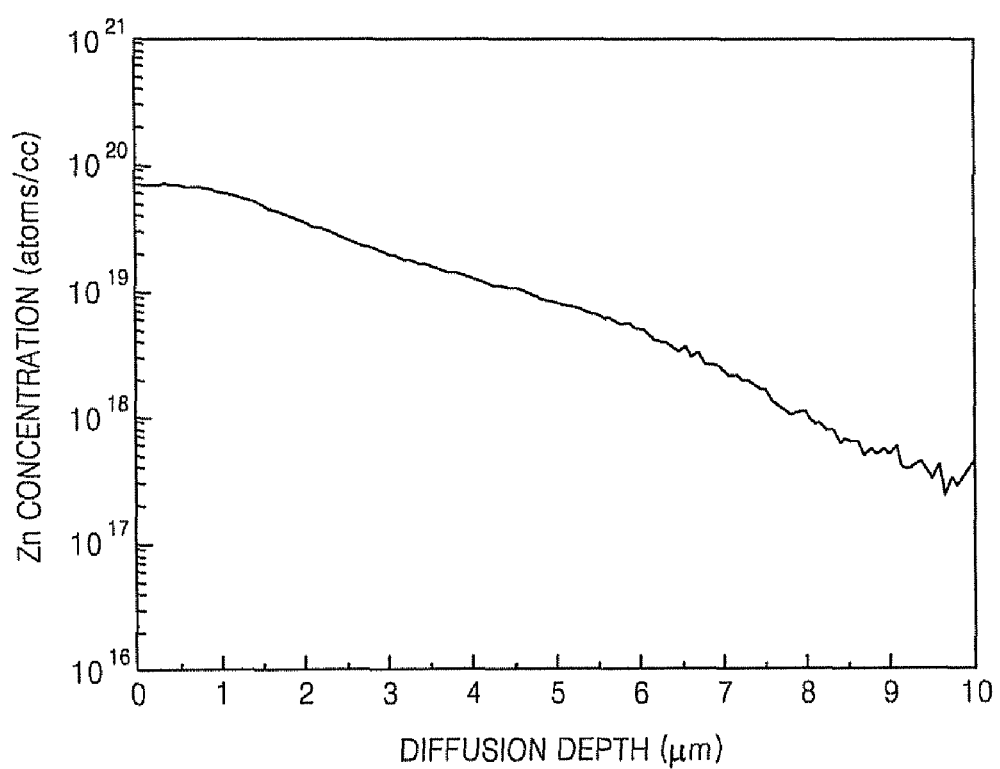
FIG. 6 is a graph illustrating a zinc (Zn) concentration versus a diffusion depth into the GaAs substrate illustrated in FIG. 5.

The following Table 3 illustrates experiment data of component ratios of zinc (Zn), gallium (Ga) and arsenic (As) in accordance with depth into the GaAs substrate of FIG. 5, and FIG. 6 is a graph illustrating zinc (Zn) concentrations versus depth portions into the gallium arsenide ("GaAs") substrate illustrated in FIG. 5.

TABLE 3

| No. | element | at. % |
|---|---|---|
| 1 | Zn | 1.14 |
|   | Ga | 46.27 |
|   | As | 52.59 |
| 2 | Zn | 3.21 |
|   | Ga | 51.59 |
|   | As | 45.49 |
| 3 | Zn | 3.83 |
|   | Ga | 54.17 |
|   | As | 42.00 |
| 4 | Zn | 0.72 |
|   | Ga | 45.99 |

TABLE 3-continued

| No. | element | at. % |
|---|---|---|
|  | As | 53.29 |
| 5 | Zn | 0.61 |
|  | Ga | 46.41 |
|  | As | 52.97 |

In Table 3, the numbers indicate depth portions illustrated in FIG. 5 (e.g., No. 1 refers to the circled portion labeled 1 in FIG. 5), and the atomic percentage (at. %) of an atom in each portion is measured using an energy dispersive X-ray spectroscopy ("EDX").

Referring to Table 3 and FIGS. 5 and 6, after the GaAs substrate was doped using the diffusion tube 10 of the present invention, the GaAs substrate exhibited high quality characteristics, and the GaAs substrate resulted with a high zinc (Zn) concentration, which was in a range of $1 \times 10^{18}$ cm$^{-3}$ to $3 \times 10^{20}$ cm$^{-3}$ at a depth of 9.4 micrometers (μm) or less. This depth refers to depth at which the concentration of zinc (Zn) is $10^{18}$ cm$^{-3}$ or greater.

Table 4 illustrates diffusion depths versus the heating temperature in the diffusion tube 10 according to an exemplary embodiment of the present invention.

TABLE 4

|  | temperature (degrees Celsius) | | | |
|---|---|---|---|---|
|  | 400 | 500 | 600 | 700 |
| diffusion depth (micrometer (μm)) | 0.43 | 1.29 | 3.20 | 9.43 |

The experiment data of Table 4 illustrates the results of performing an exemplary embodiment of the diffusion process of the present invention using the dopant source 19, in which the mixing ratio of zinc (Zn) powder and arsenic (As) powder was 2:1, and under the same diffusion conditions as the experiment illustrated in Table 2 above, except for the experimental conditions and the heating temperatures illustrated in Table 2. In Table 4, the diffusion depth refers to the depth where the concentration of zinc (Zn) is $10^{18}$ cm$^{-3}$ or greater.

As shown from Table 4, in one exemplary embodiment the diffusion method is performed at a constant heating temperature of 700 degrees Celsius in order to achieve a sufficient diffusion depth.

Table 5 illustrates the electrical characteristics of the gallium arsenide ("GaAs") substrate doped with zinc (Zn) by the diffusion method according to an exemplary embodiment of the present invention.

TABLE 5

| sample | type | ρ (Ωcm) | p (cm$^{-3}$) | μ (cm$^2$/Vsec) |
|---|---|---|---|---|
| diffusion tube 10 (zinc (Zn) powder) + (arsenic (As) powder) | p-type | 0.0467 | $1.87 \times 10^{19}$ | 7.14 |

The experiment data illustrated in Table 5 above shows the results of performing a diffusion process using the dopant source 19, in which a mixing ratio of zinc (Zn) powder and arsenic (As) powder was 2:1, on a GaAs substrate, under the same diffusion conditions as the experiment illustrated in Table 2 above, and by hole measurements using a van der Pauw configuration.

According to an exemplary embodiment of the diffusion method of the present invention, a diffusion layer can be formed on the GaAs substrate with a high concentration, in a range of about $10^{19}$ cm$^{-3}$ or higher, such as about 10% of the activation ratio of zinc (Zn).

An exemplary embodiment of the diffusion tube 10 of the present invention, the dopant source 19 for a diffusion process, and the diffusion method using the diffusion tube 10 and the dopant source 19 according to the present invention provide the effects as follows.

In one exemplary embodiment, the diffusion target 18 or portion thereof can be easily controlled by diffusing the vapor of the dopant source 19 through the neck 12 onto the diffusion target 18 by employing a diffusion tube 10 which includes a neck 12, wherein the diffusion target 18 and the dopant source 19 are spaced apart from each other.

In another exemplary embodiment, the dopant source 19 can be diffused into the diffusion portion of the diffusion target 18 with a uniformly high concentration of $10^{19}$ cm$^{-3}$ or greater, and to a deep depth of 9 micrometers (μm) or greater.

In another exemplary embodiment, the dopant source 19 for the diffusion process according to the present invention uses a mixture including zinc (Zn) powder and arsenic (As) powder, and the diffusion speed is further improved compared to that of the conventional dopant source thereby shortening the fabrication time for fabrication processes, and reducing defective products generated in the fabrication processes.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A diffusion apparatus comprising:
a diffusion tube comprising:
a diffusion housing which includes a first cavity at a first end which receives a diffusion target, and a second cavity at a second end which receives a dopant source for diffusion; and
a diffusion port disposed between the diffusion target and the dopant source,
wherein the diffusion port provides fluid communication between the first cavity and the second cavity, and
a heating furnace;
wherein an entire of the diffusion tube is entirely heated inside the heating furnace after receiving the diffusion target and the dopant source in order to diffuse the dopant source into the diffusion target, and
wherein
the entire diffusion tube is heated at a substantially equal temperature, and
the first cavity, the diffusion port and the second cavity are linearly arranged.

2. The diffusion apparatus of claim 1, wherein the sectional area of the diffusion port is less than a sectional area of at least one of the first cavity and the second cavity.

3. The diffusion apparatus of claim 2, wherein the diffusion housing includes a first tube defining the first cavity.

4. The diffusion apparatus of claim 3, wherein the diffusion housing includes a second tube defining the second cavity.

5. The diffusion apparatus of claim 4, wherein the diffusion port is a neck which connects the first and second tubes, the neck provides fluid communication between the first and second cavities, and the neck spaces apart the diffusion target and the dopant source are spaced apart from each other.

6. The diffusion apparatus of claim 1, wherein at least one hole is formed on the diffusion housing.

7. The diffusion apparatus of claim 1, wherein a single hole is formed on the diffusion housing positioned between the first end and the diffusion port.

8. The diffusion apparatus of claim 7, wherein another hole is formed on the diffusion housing positioned between the second end and the diffusion port.

9. The diffusion apparatus of claim 1, wherein a single hole is formed on the diffusion housing positioned between the second end and the diffusion port.

* * * * *